(12) United States Patent
Rieder

(10) Patent No.: US 10,823,346 B2
(45) Date of Patent: Nov. 3, 2020

(54) LED MODULE, LED LIGHT FIXTURE AND METHOD FOR PRODUCTION THEREOF

(71) Applicant: LEDVANCE GmbH, Garching bei Munchen (DE)

(72) Inventor: Bernhard Rieder, Regensburg (DE)

(73) Assignee: LEDVANCE GMBH, Garching bei Munchen (DE)

( * ) Notice: Subject to any disclaimer, the term of this patent is extended or adjusted under 35 U.S.C. 154(b) by 0 days.

(21) Appl. No.: 16/387,709

(22) Filed: Apr. 18, 2019

(65) Prior Publication Data

US 2019/0323666 A1 Oct. 24, 2019

(30) Foreign Application Priority Data

Apr. 18, 2018 (DE) .................. 10 2018 109 216

(51) Int. Cl.
*F21S 4/20* (2016.01)
*H01L 33/50* (2010.01)
*F21V 23/00* (2015.01)
*H01L 33/52* (2010.01)

(52) U.S. Cl.
CPC .............. *F21S 4/20* (2016.01); *F21V 23/004* (2013.01); *H01L 33/50* (2013.01); *H01L 33/52* (2013.01)

(58) Field of Classification Search
CPC ................................ F21V 23/004; F21S 4/20
See application file for complete search history.

(56) References Cited

U.S. PATENT DOCUMENTS

2007/0041220 A1* 2/2007 Lynch ................. F21V 19/0055
362/646

* cited by examiner

*Primary Examiner* — Joseph L Williams
*Assistant Examiner* — Jacob R Stern
(74) *Attorney, Agent, or Firm* — Hayes Soloway PC

(57) ABSTRACT

A light emitting diode (LED) module is disclosed having an elongated flat support with a first long end, a second long end opposite the first long end, and electrically conductive regions. The disclosed LED module includes at least one LED mounted on the flat support as well as an electronic driver with at least one electronic driver component mounted on the flat support for driving the at least one LED. The electrically conductive regions have a first pair of contact points on one of the two long ends for connection of the LED module to a current source and a second pair of contact points on one of the two long ends for connection of a smoothing capacitor on the LED module.

20 Claims, 10 Drawing Sheets

US 10,823,346 B2

LED MODULE, LED LIGHT FIXTURE AND METHOD FOR PRODUCTION THEREOF

CROSS-REFERENCE

This patent application claims the benefit of and priority to German Patent Application No. 10 2018 109 216.4 filed on Apr. 18, 2018, the entire disclosure of which is incorporated herein by reference.

TECHNICAL FIELD

The invention relates generally to an LED module and specifically to an LED module for use in an LED light fixture. Furthermore, it relates to a method for producing the LED module and the LED light fixture.

TECHNICAL BACKGROUND

Due to the long service life and high efficiency of LEDs (light emitting diodes) conventional light fixtures are increasingly being supplanted by LED-based light fixtures. In this case the LEDs are operated as current-controlled electrical components with special electrical drivers which supply the LEDs with electrical current. In particular due to short response times of LEDs any current fluctuations during operation can lead to undesirable flickering of LED light fixtures.

SUMMARY

An object of embodiments of the invention is to provide a compact and cost-effective LED module for use in an LED light fixture which makes it possible to suppress or reduce the flickering of LED light fixtures.

In order to achieve this object, according to a first aspect an LED module is proposed. The LED module comprises an elongated flat support with a first long end, with a second long end opposite the first long end and with electrically conductive regions or conductive tracks. Furthermore, the LED module has at least one LED mounted on the flat support as well as an electronic driver with electronic driver components for driving the at least one LED. The electrically conductive regions comprise a first pair of contact points on one of the two long ends for connection of the LED module to a current source and a second pair of contact points on one of the two long ends for connection of a smoothing capacitor, in particular for smoothing of fluctuations of the current flowing through the at least one LED, on the LED module.

The at least one LED can in particular comprise a number of series-connected LEDs. Due to the series connection a plurality of LEDs can be driven using a common current regulator. Moreover, due to the apposition of LEDs the operating voltage of the resulting LED string can be adapted as applicable to the rated voltage of available drivers.

The contact points are portions of the electrically conductive regions which are substantially free of LEDs or electrical components. The contact points are designed in particular for providing contacts, in particular solder contacts, for connection of the LED module to the current source or to the smoothing capacitor.

Due to the lengthwise arrangement of the two pairs of contact points, contact pins for connecting the current source or the smoothing capacitor with respect to the support can be arranged longitudinally in such a way that the three-dimensional configuration or the shape factor of the LED module together with contact pins and smoothing capacitor is not or is not significantly hampered by the smoothing capacitor with regard to the usability of the LED module, in particular in a light fixture.

The at least one LED can be designed as a bare LED chip. The bare or unhoused LED chips have a particularly compact construction.

The at least one electronic driver component can likewise be constructed as a bare chip. In particular the LED module can be designed as a COB (chip on board) module, in which the bare or unhoused semiconductor chips are mounted directly on the support or printed circuit board. Due to the chip on board mounting the LED module can have a compact construction and can be produced cost-effectively. In particular both the LEDs and also the electronic driver components can be mounted on the support in a common process step (die bonding) and can be equipped with bonding wires in a common process step (wire bonding). In this case the bonding wires can be laid on the support both between the individual electrical components, in particular between LEDs or electronic driver components, and also between the electrical components and electrically conductive regions or conductive tracks, so that a driver circuit with the required topology can be provided in a simple manner.

The at least one LED can be provided with an encapsulation, in particular with a light-scattering encapsulation. Due to the light scattering in the encapsulation the emission characteristic of the LED module can be homogenised.

The encapsulation can have a substantially light-permeable or transparent base material in which scattering centres, in particular diffuser particles or bubbles, are distributed substantially in a three-dimensionally uniform manner. As a result, a substantially diffuse uniform illumination of the encapsulation can be achieved.

The encapsulation can have at least one fluorescent substance for transformation or conversion of the LED light. Specifically, the at least one fluorescent substance may transform the original LED light wavelength into a light with a wavelength different from the original LED light wavelength. In particular the colour spectrum of the secondary light emitted by the encapsulation can be changed by the at least one fluorescent substance.

In some embodiments the at least one LED is designed as an LED emitting in the blue or the UV spectral range, wherein due to the light conversion in the at least one fluorescent substance the encapsulation emits a white light. The at least one fluorescent substance can in particular have a plurality of, in particular three or more, fluorescent substances or phosphors which illuminate in different colours, so that an improved colour rendering of the light emitted by the encapsulation can be achieved.

In some embodiments the at least one fluorescent substance is in the form of fluorescent particles distributed substantially in a three-dimensionally uniform manner. Due to the scattering of the light on fluorescent particles in particular the diffusivity or the uniformity of the illumination of the encapsulation can be increased.

The at least one LED can be formed as an LED illuminating substantially omnidirectionally or in the full solid angle, for example, on the basis of sapphire chips. The omnidirectionality of the LED primary light contributes to the homogenisation of the emission of the LED module, so that the uniformity of the emission of the LED module can be further improved.

The support can be designed as a ceramic support, for example, as a ceramic printed circuit board with conductive tracks, in particular for electrical connection of the LEDs or other components. Such a ceramic support has good insulating properties and high thermal conductivity. The LED module can also have bonding wires for connection of individual components, specifically, the LEDs and electronic drive components to one another or to the conductive tracks of the support. The wiring flexibility can be increased, for example, when unhoused components are used, by the use of bonding wires, which makes a particularly space-saving construction of the LED module possible. Furthermore, the support can have thermal and/or electrical vias or through contacts, so that the thermal characteristics as well as the wiring flexibility of the support can be further increased, for example, with LEDs mounted on both sides.

In some embodiments the support is at least to some extent light permeable. Due to the light transmittance of the support, the light generated on one side of the support can shine through the support, which contributes to an increase in the homogeneity of the emission characteristics, in particular with LEDs mounted on one side. The support can be designed to allow at least 50%, or at least 70% of the LED light incident on the support to be transmitted through the printed circuit board. The light-permeable support can have quartz glass ($SiO_2$), sapphire ($Al_2O_3$), mullite ceramic (silicate ceramic type C610/620) and/or aluminium nitride (AlN). The use of light-permeable supports makes it possible to utilise the omnidirectional light emission of volume emitters or sapphire chips, so that even when the support is fitted with LEDs on one side, a high omnidirectionality or uniform light density can be achieved with the LED module.

Alternatively, a correspondingly structured leadframe can be used as support. In particular the leadframe can have cutouts at predetermined locations for implementation of a required circuit topology of the LED driver.

The leadframe can also have further cutouts or holes, so that the light can pass through the support. Because of the holes in the leadframe, omnidirectionality of the emission can also be achieved with the LEDs mounted on one side, as in a (partially) light-permeable substrate.

In some embodiments LEDs are arranged on both sides on both main surfaces of the flat support. Due to the two-sided arrangement of the LEDs a particularly symmetrical light distribution of the illumination of the LED module can be achieved.

The electronic driver can comprise a bridge rectifier and a current regulator series connected to the at least one LED. Thus the LED module can be implemented as a so-called light engine, that is to say an LED light source together with a driver in one module.

The bridge rectifier can be electrically connected on the input side to the first pair of contact points and on the output side to the second pair of contact points. By such a connection the smoothing capacitor can be connected to the output of the bridge rectifier, so that the entire LED/current regulator strand can be supplied with a smoothed d.c. voltage for reduction of flickering in the LEDs.

In some exemplary embodiments the LED module is constructed with the contact points arranged for connection of the smoothing capacitor to the positive output of the bridge rectifier and to the connection point between the at least one LED and the current regulator. In this way, a driver topology can be implemented which allows the smoothing capacitor to smooth the voltage directly applied to the LEDs, so that effects of any fluctuations attributable to the current regulator can be reduced.

In some embodiments the first pair of contact points and the second pair of contact points are formed on opposing long ends of the support. The arrangement of the contact points on opposite ends of the support enables an enlargement of the space available for individual contact points, so that a risk of short-circuit between the contacts can be reduced. Moreover, this arrangement of the contact points simplifies the maintenance of air and leakage paths or permissible minimum spacings between the conductive regions.

In some embodiments both the first pair or contact points and the second pair of contact points are formed on the same side or on the same long end of the support. This arrangement of the contact points enables a particularly compact construction of the LED module, in that for example the smoothing capacitor is arranged between the contact pins of the power connection or conversely the contact pins of the power connection are arranged between the contact pins of the smoothing capacitor.

The smoothing capacitor or the contact pins can be formed as part of the LED module. The LED module can also be provided without the contact pins or without the smoothing capacitor, so that it can be fitted with customer-specific contact pins or a customer-specific smoothing capacitor.

According to a second aspect, a method for producing the LED module is proposed. The method comprises the provision of an elongated flat support with a first long end, with a second long end opposite the first long end and with electrically conductive regions, wherein the electrically conductive regions comprise a first pair of contact points on one of the two long ends for connection of the LED module to a current source and a second pair of contact points on one of the two long ends for connection of a smoothing capacitor on the LED module. Furthermore the method comprises the mounting of at least one LED on the flat support as well as the mounting of at least one driver component for driving the at least one LED.

In one embodiment of the method, the mounting of the at least one LED and the mounting of the at least one electronic driver component take place substantially simultaneously. In particular the mounting of the LED and the mounting of the at least one electronic driver component in a die bonding step can take place substantially simultaneously.

Furthermore, the method can comprise the wire bonding of the at least one LED and/or at least a driver component and the potting of the at least one LED with an encapsulation.

In particular, after the potting of the LEDs, solder contacts are provided for connection of the first pair of contact points with contact pins for connection of the LED module to a current source and for connection of a smoothing capacitor to the second pair of contact points.

The method makes it possible to produce an LED module according to the first aspect in a simple manner.

According to a third aspect an LED light fixture is provided which comprises an LED module according to the first aspect. In such a light fixture, low flickering can be combined with compact construction.

The LED light fixture can be designed as an LED replacement light fixture, in particular for replacement of a conventional light fixture. In particular the LED light fixture can comprise a light-permeable body formed according to the form of the light fixture to be replaced as well as an LED module with contact pins, in particular for power supply, and with a smoothing capacitor according to the first aspect.

Because of the lengthwise arrangement described above of the contact points or the contact pins for connection of the current source or the smoothing capacitor, the LED module can be accommodated in the light fixture in such a way as to retain the shape or the dimensions of the light fixture to be replaced.

The light-permeable body can be constructed as a glass body with a sealed cavity in which the light-scattering element is located. The glass body or glass housing is advantageous and can be produced in a simple manner. Moreover, the glass housing gives the LED light fixture an appearance similar to the conventional light fixture to be replaced.

The LED light fixture can be constructed in such a way that the light-scattering element is encapsulated in the cavity of the glass body in an airtight manner, wherein the LED module is completely or partially enclosed in the cavity. The power supply to the encapsulated LED module can be provided by the contact pins which protrude through a wall of the glass body into the cavity and are sealed laterally on the wall.

The cavity can have a gas filling which contains a gas with high thermal conduction, for example, helium, so that the heat dissipation from the LED module to the glass housing or to the environment can be improved.

BRIEF DESCRIPTION OF THE DRAWINGS

The present disclosure will now be explained in greater detail with reference to the appended drawings. The same references are used for the same or equivalent parts.

DETAILED DESCRIPTION

Figure 1:
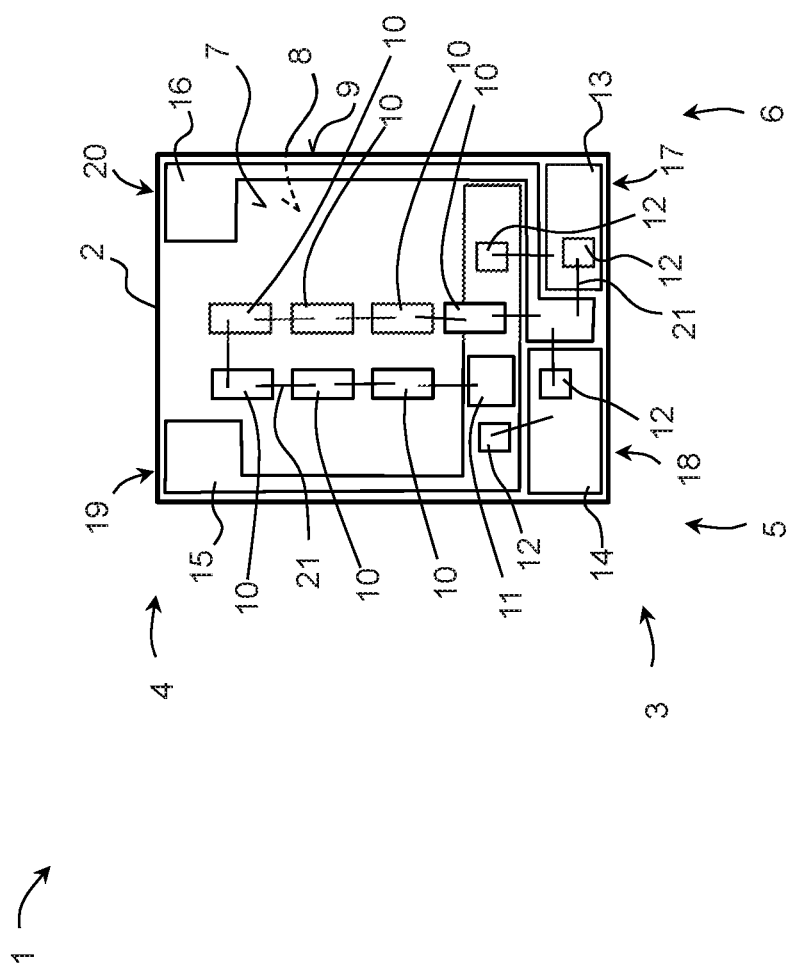
FIG. 1 shows a schematic view from above of an LED module according to an exemplary embodiment.

FIG. 1 shows a schematic view from above of an LED module according to an exemplary embodiment. The LED module 1 has a flat substantially rectangular support 2 or substrate constructed lengthwise with a first long end 3 (at the bottom in FIG. 1), a second long end 4 opposite the first long end 3, a first lateral end 5 (on the left in FIG. 1) and a second lateral end 6 opposite the first lateral end. The support 2 also has a first main surface 7 which can be seen in the view from above in FIG. 1, a second main surface 8 opposite the first main surface 7, and a lateral surface 9. In this exemplary embodiment the support 2 is a ceramic support or a ceramic printed circuit board, wherein the first main surface 7 is constructed as a mounting surface for mounting electronic components. Furthermore, the LED module 1 has a series of LEDs 10, a transistor 11 and four diodes 12. These components are mounted on the first main surface 7 of the support 2. The first main surface 3 has metal plated structures 13, 14, 15, 16. The metal plated structures 13, 14, 15, 16 comprise a first contact point 17, a second contact point 18, a third contact point 19 and a fourth contact point 20. The contact points 17, 18, 19, 20 are regions of the metal plated structures 13, 14, 15, 16 which are free of components and are constructed for contacting with or mounting of external components. In the exemplary embodiment shown in FIG. 1 the first and the second contact points 17, 18 are constructed on the first long end 3 or on the lower edge of the support 2. The third and the fourth contact points 19, 20 are constructed on the second long end 4 or on the upper edge of the support 2.

Furthermore, the LED module 1 has a number of bonding wires 21 for connection of the electrical components arranged on the support 2 to the metal plated structures 13, 14, 15, 16 or to other electronic components. The diodes 12 are connected by the bonding wires 21 or by the metal plated structures 13, 14, 15, 16 to a bridge rectifier for power supply to the LEDs 10, wherein the first metal plated structure 13 or first contact point 17 and the second metal plated structure 14 or the second contact point 18 form alternating current inputs of the bridge rectifier. The two outputs of the bridge rectifier are formed by the metal plated structures 15 and 16, so that the third and fourth contact points 19, 20 formed by the metal plated structures 15 and 16 constitute outputs of the bridge rectifier on the second long end 4 or on the upper edge of the support 2. The LEDs 10 are series-connected to the transistor 11 between the two outputs of the bridge rectifier.

The LED module 1 also has an encapsulation (not shown) which covers the LEDs 10. In some exemplary embodiments the encapsulation is a silicone encapsulation which is applied flat to one or both mounting surfaces.

The LED module 1 can be electrically connected by the first contact point 17 and the second contact point 18 to an alternating current source, for example, by contact pins or wires. In this case the LEDs 10 are supplied with electrical current by the driver formed by the diodes 12 and the transistor 11 and are illuminated. For smoothing the output voltage of the LED driver or of the current flowing through the LEDs 10, a smoothing capacitor can be connected between the third contact point 19 and the fourth contact point 20.

Figure 2:
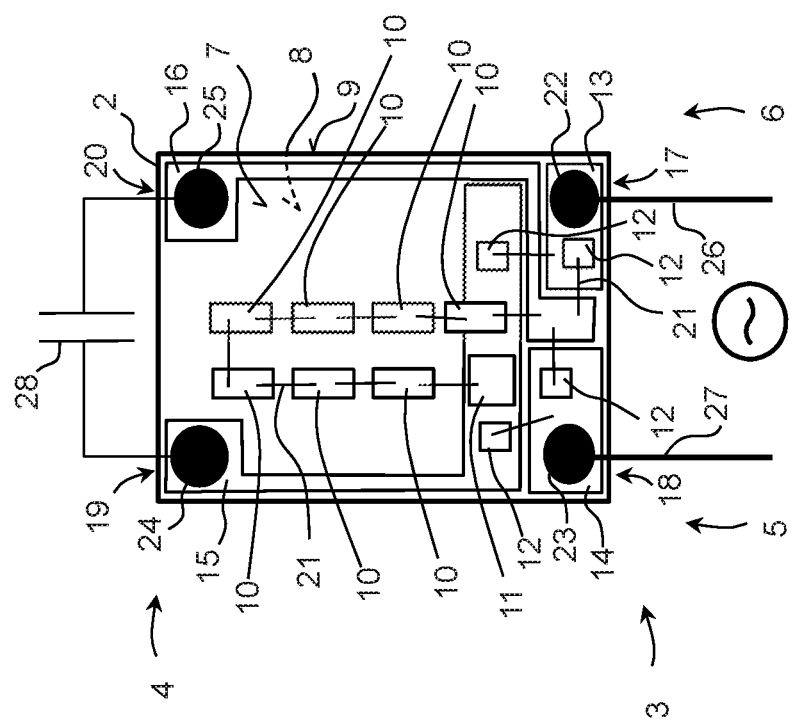
FIG. 2 shows a schematic view from above of an LED module according to another exemplary embodiment.

FIG. 2 shows a schematic view from above of an LED module according to another exemplary embodiment. The LED module of FIG. 2 corresponds substantially to the LED module of FIG. 1 and also has a first contact 22 at the first contact point 17, a second contact 23 at the second contact point 18, a third contact 24 at the third contact point 19 and a fourth contact 25 at the fourth contact point 20. The contacts 22, 23, 24 and 25 are constructed as solder contacts. The first contact 22 and the second contact 23 are connected to a first contact pin 26 and to a second contact pin 27 for connection of the LED module 1 to an alternating current source. A smoothing capacitor 28 is connected or soldered to the third contact 24 and to the fourth contact 25. In this exemplary embodiment the smoothing capacitor 28 is an electrolytic capacitor with a positive contact, with a negative contact and with a capacitance of 1 μF. In some embodiments the smoothing capacitor 28 is constructed as a ceramic capacitor. In some embodiments the smoothing capacitor has a capacitance between 1 μF and 10 μF. The smoothing capacitor 28 is soldered with legs to the contacts 24 and 25. Alternatively or in addition the smoothing capacitor 28 can be connected by wires or contact pins to the contacts 24, 25. In some embodiments the smoothing capacitor 28 is concealed under a tubular cover. Alternatively, or additionally, the smoothing capacitor 28 can be encapsulated with a silicone, for example, coloured silicone, in order to shield it from direct view.

Figure 3:
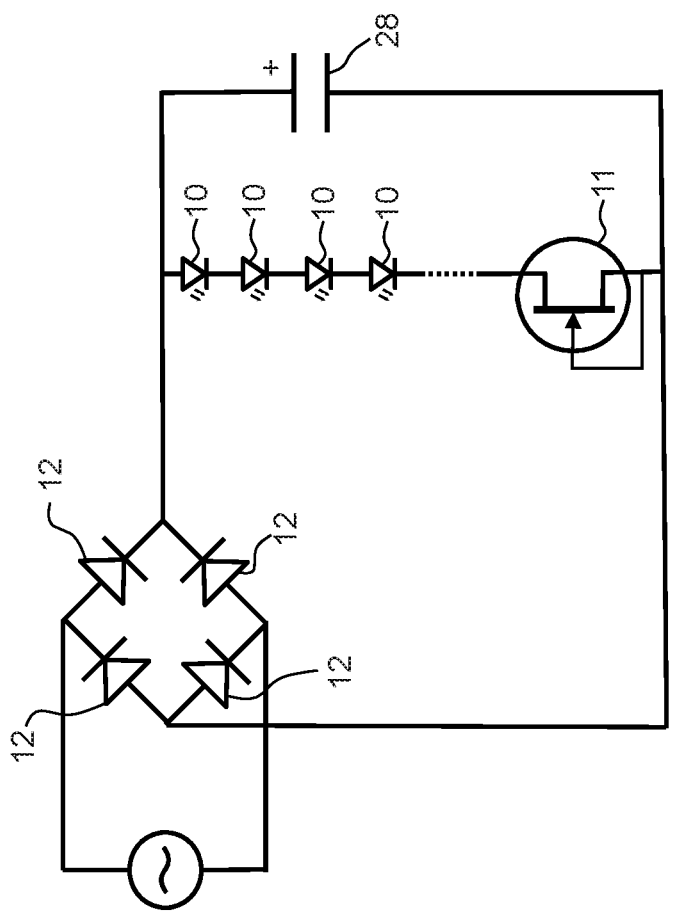
FIG. 3 shows an electrical circuit diagram of an LED module according to FIG. 2.

FIG. 3 shows an electrical circuit diagram of an LED module according to FIG. 2. In FIG. 3 the number of LEDs 10 is represented by way of example by four LEDs 10. The LEDs 10 as well as the transistor 11 are series-connected or connected to form a strand which is connected between a cathode-side or positive output and an anode-side or negative output of the diode bridge or the bridge rectifier. The smoothing capacitor 28 is an electrolytic capacitor of which the positive contact is connected to the cathode-side output of the bridge rectifier and of which the negative contact is connected to the anode-side output of the bridge rectifier. Thus, in the configuration shown, the smoothing capacitor 28 is electrically connected directly to the outputs of the bridge rectifier. This electrical connection between the smoothing capacitor 28 and the outputs of the bridge rectifier takes place through the contacts 24 and 25 or metal plated structures 15 and 16 of the LED module 1, cf. FIG. 2 at the top.

During operation the smoothing capacitor 28 ensures that the output voltage of the bridge rectifier or the current flowing through the LEDs 10 is smoothed in order to suppress or to reduce the oscillation of the current flowing through the LEDs 10 which is attributable to the current or voltage oscillation of the alternating current source. The smoothing effect depends upon the capacitance of the smoothing capacitor and is more pronounced with greater capacitance of the smoothing capacitor 28.

Figure 4:
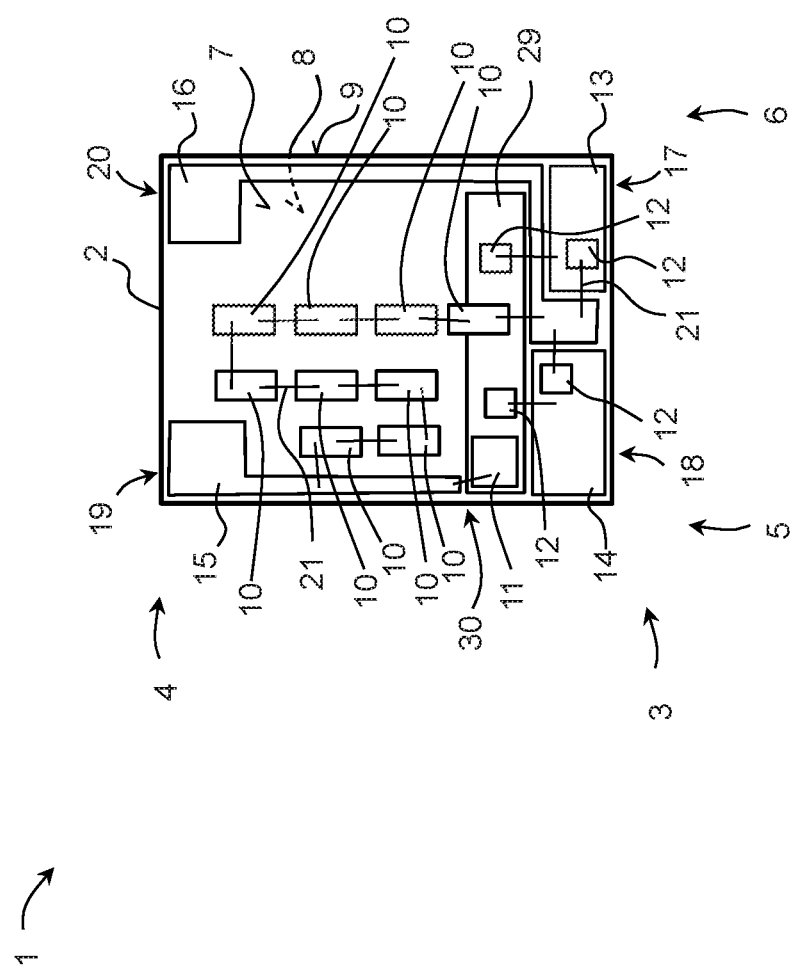
FIG. 4 shows a schematic view from above of an LED module according to another exemplary embodiment.

FIG. 4 shows a schematic view from above of an LED module according to another exemplary embodiment. The LED module 1 in this exemplary embodiment corresponds substantially to the LED module illustrated in FIG. 1. The LED module 1 of FIG. 4 differs from the LED module illustrated in FIG. 1 inter alia by the configuration of the metal plated structures formed on the first main surface 7. The LED module 1 of FIG. 4 has in particular a further metal plated structure 29 or a metal plated island, from which the metal plated structure 15 forming the third contact point 19 is separated by a gap 30 which is spanned by a bonding wire 21 connecting the transistor 11 to the metal plated structure 15. In the configuration shown in FIG. 4 the metal plated island or the metal plated structure 29 serves as negative output of the bridge rectifier on which the transistor 11 and two diodes 12 are arranged on the anode side. Like the LED module of FIG. 1, the LED module of FIG. 4 can be connected by contact points 17, 18, 19, 20 to an alternating current source or to a smoothing capacitor as in FIG. 2.

Figure 5:
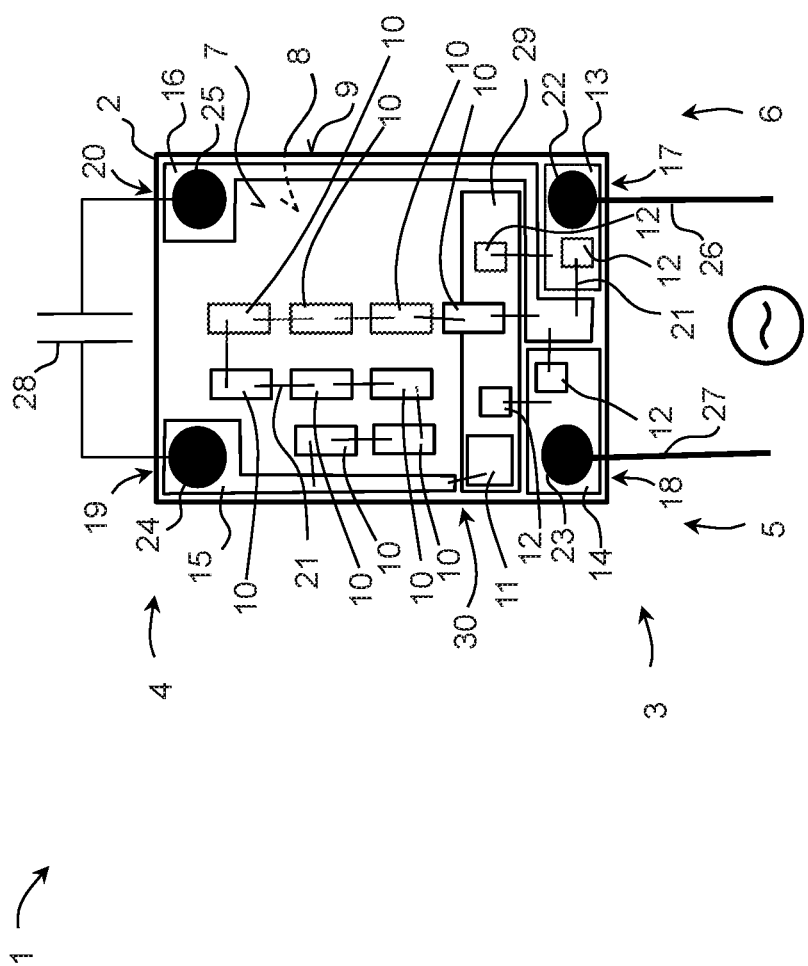
FIG. 5 shows a schematic view from above of an LED module according to another exemplary embodiment.

FIG. 5 shows a schematic view from above of an LED module according to another exemplary embodiment. As in FIG. 2, the LED module of FIG. 1 has a first contact 22 at the first contact point 17, a second contact 23 at the second contact point 18, a third contact 24 at the third contact point 19 and a fourth contact 25 at the fourth contact point 20. The first contact 22 and the second contact 23 are connected to a first contact pin 26 and to a second contact pin 27 for connection of the LED module 1 to an alternating current source. A smoothing capacitor 28 is connected to the third contact 24 and to the fourth contact 25.

Figure 6:
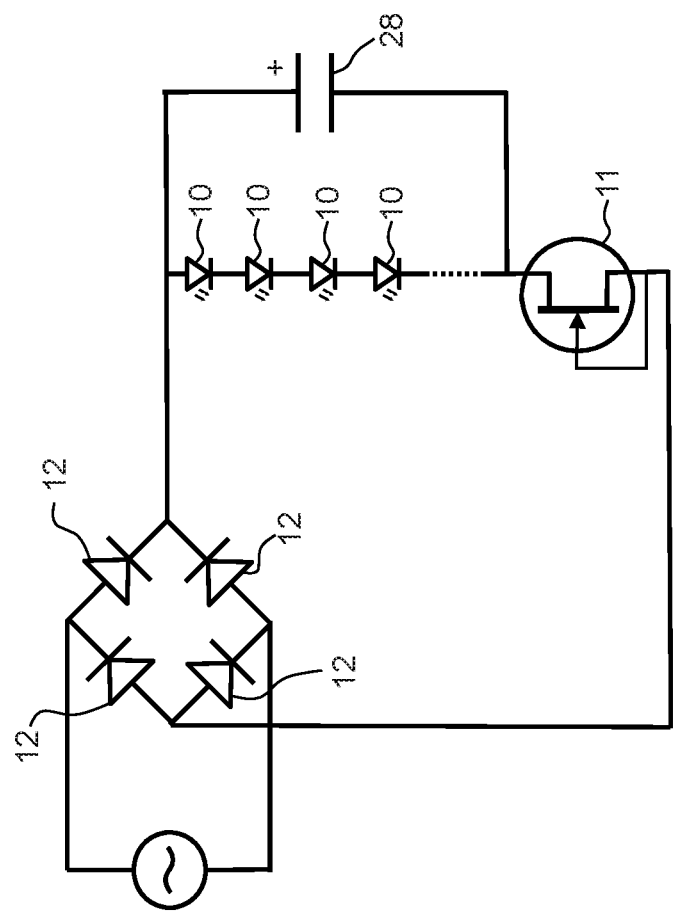
FIG. 6 shows an electrical circuit diagram of an LED module according to FIG. 5.

FIG. 6 shows an electrical circuit diagram of an LED module according to FIG. 5. The circuit diagram shown in FIG. 6 corresponds substantially to the topology of the circuit diagram shown in FIG. 3 with the difference that the smoothing capacitor 28 is not parallel-connected but series-connected with respect to the transistor 11. In the configuration shown, the smoothing capacitor 28 ensures that the voltage applied to the LEDs 10 or the current flowing through the LEDs 10 remains constant.

Figure 7:
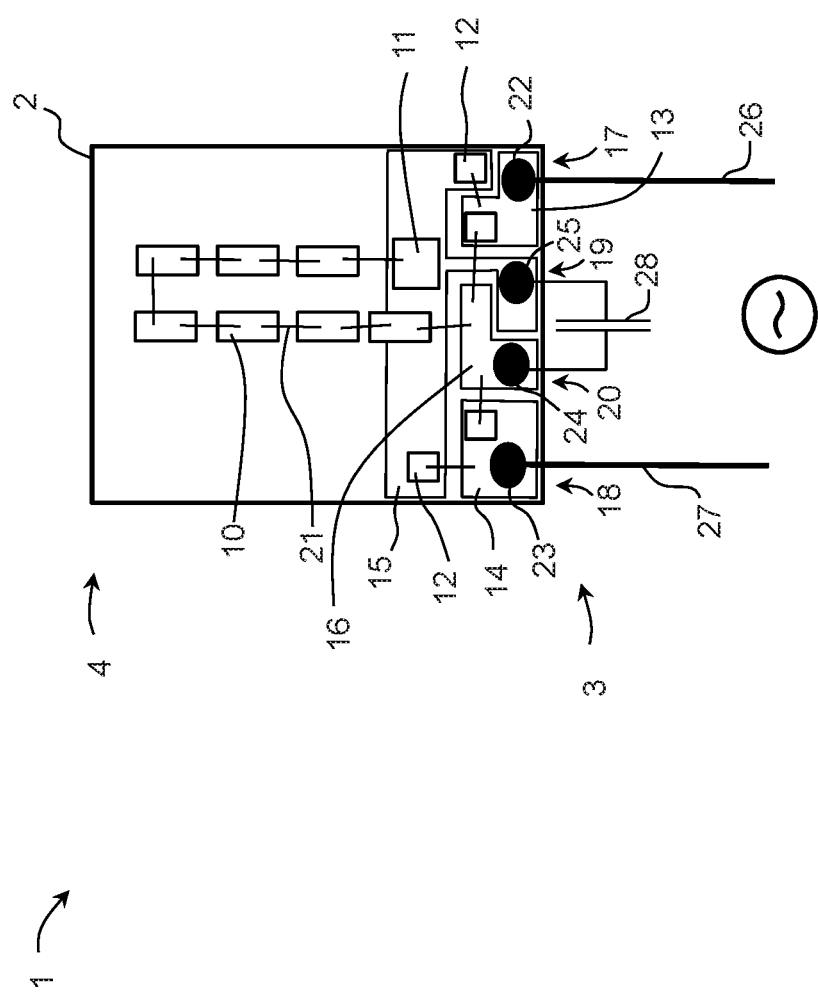
FIG. 7 shows a schematic view from above of an LED module according to another exemplary embodiment.

FIG. 7 shows a schematic view from above of an LED module according to another exemplary embodiment. The LED module 1 of FIG. 7 has substantially the same elements as exemplary embodiments described above, wherein the LED module 1 is already fitted with the smoothing capacitor 28 and with the contact pins 26, 27. In contrast to the first two exemplary embodiments, however, the metal plated structures 13, 14, 15, 16 are constructed in such a way that all the contact points 17, 18, 19, 20 with the contacts 22, 23, 24, 25 are arranged on the first long end 3 (at the bottom in the picture) of the LED module, wherein the connection of the electrical components corresponds to the topology shown in FIG. 3. As can be seen from FIG. 7, with corresponding dimensions of the smoothing capacitor 28 or of the LED module the smoothing capacitor 28 can be accommodated in a space-saving manner between the contact pins 26 and 17.

Figure 8:
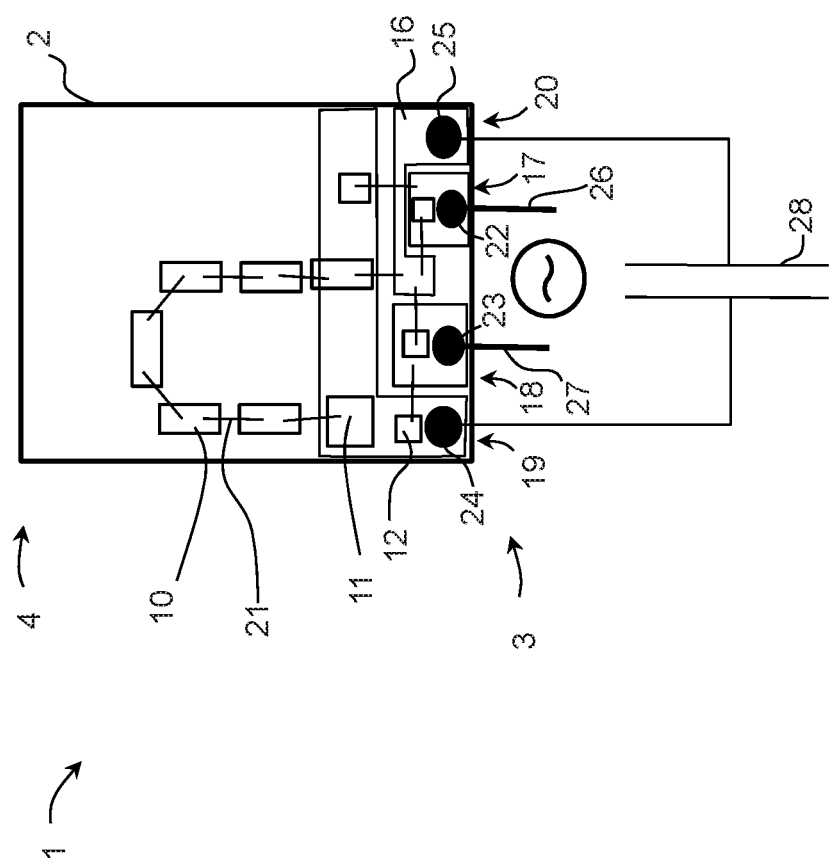
FIG. 8 shows a schematic view from above of an LED module according to another exemplary embodiment.

FIG. 8 shows a schematic view from above of an LED module according to another exemplary embodiment. In this exemplary embodiment the LED module 1 has a similar construction to that of the exemplary embodiment of FIG. 7 in such a way that the contact points 17, 18, 19, 20 with the contacts 22, 23, 24, 25 are arranged on the first long end 3 (at the bottom in the picture) of the LED module 1. However, the connection of electronic components corresponds to the second topology or the topology shown in FIG. 6. The contacts 22 and 23 for connection of an alternating current source are located between the contacts for connection of the smoothing capacitor. In some circumstances, in particular in the event of specific dimensions of the smoothing capacitor and as a function of the space available in the light fixture for the use of the LED module, this configuration can be particularly advantageous in order to accommodate the LED module together with smoothing capacitor in a light fixture.

Due to the arrangement of the contact points 17, 18, 19, 20 or the contacts 22, 23, 24, 25 in all the exemplary embodiments shown here, external contact pins for connection to an alternating current source and the smoothing capacitor 28 can be arranged longitudinally with respect to the support 2 in such a way that the three-dimensional configuration or the shape factor and thus also the capability of installation of the LED module 1, in particular in a light fixture, is not or is not significantly hampered by the smoothing capacitor.

For the production of the LED module, in a first step a longitudinally constructed flat support with electrically conductive regions or conductive tracks can be provided, wherein the electrically conductive regions are constructed according to one of the exemplary embodiments of the LED module described above. The support can be an at least partially light-permeable ceramic support or a correspondingly structured leadframe.

In a subsequent step LEDs and electronic driver components, in particular as bare or unhoused components, are mounted on the support. The mounting of the LEDs and the electronic driver components can take place substantially simultaneously in a die bonding step.

In a further step, bonding wires for connection of the electrical components arranged on the support 2 to the conductive regions or to other electronic components can be mounted (bonding wires), after which the LEDs can be provided with an encapsulation. The encapsulation can be constructed as a diffuse or milky light-scattering encapsulation, for example, a silicone encapsulation.

After this, if applicable, solder contacts can be provided for connection of the first pair of contact points with contact pins for connection to a current source and solder contacts can be provided for connection of a smoothing capacitor to the second pair of contact points.

The attachment of the solder contacts to the contact points 17, 18, 19 and 20 or the soldering of the smoothing capacitor 28 and the contact pins 26 and 27 can take place in a soldering step immediately after the potting of the LEDs 10 with the encapsulation.

Figure 9:
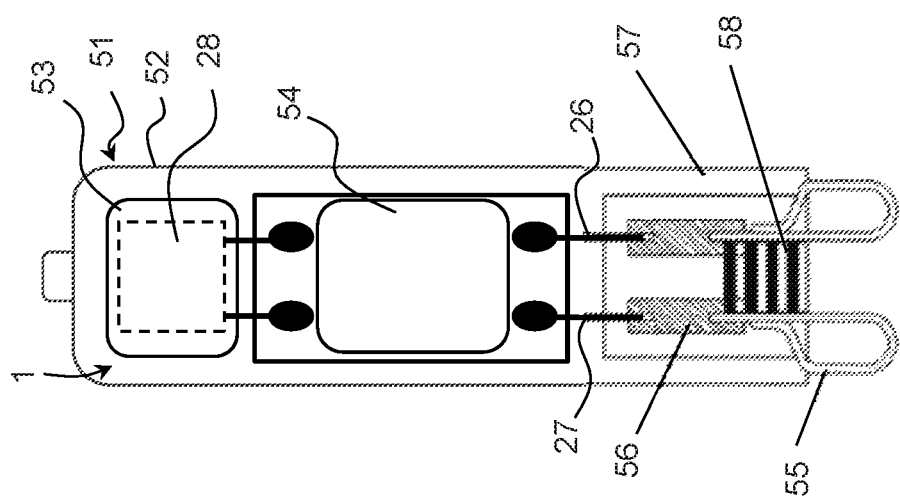
FIG. 9 shows a schematic view from above of an LED light fixture according to an exemplary embodiment.

FIG. 9 shows a schematic view from above of an LED light fixture according to an exemplary embodiment. The LED light fixture 50 comprises an LED module 1 which is constructed according to the embodiment of FIG. 2. The LED light fixture 50 also comprises a glass body 51 with a wall 52, wherein the LED module 1 is located inside the glass body 51. The LED module 1 comprises a smoothing capacitor 28 which is provided with a cover 53. In this exemplary embodiment the cover is constructed as a substantially white silicone tube. In FIG. 9 the encapsulation 54 or the LED encapsulation is also illustrated schematically. The LED light fixture 50 also has contact pins 55 which are connected by contact plates 56 of the glass body 51 to the contact pins 26 and 27 of the LED module 1 through the wall 52. The glass body 51 has a flattened area 57 on which the contact plates 56 are sealed on the wall 52 of the glass body 51. In the region of the contact pins 55, in particular between the contact pins 55, a reinforcement 58 or reinforcement structure is provided for mechanical reinforcement of the connection region of the LED light fixture 50. The reinforcement 58 can comprise insulating reinforcing plates or protrusions arranged transversely with respect to the contact pins in the region of the flattened area 57.

The contact plates can be constructed as molybdenum films, and when this film is used it is possible to compensate for a different thermal coefficient of expansion of the material of the electrical contact pins 26, 27 or the contact pins 55 and the material of the glass body 51 or glass bulb. In particular, the glass body 51 can be formed with quartz glass. Alternatively, in the case of tempered glass it is possible that the connection of the LED module towards the exterior comprises a wire, for example a molybdenum wire, a tungsten wire or an iron-nickel-cobalt wire, since with tempered glass in conjunction with the said electrically conductive materials no adaptation of the coefficients of thermal expansion is necessary.

Figure 10:
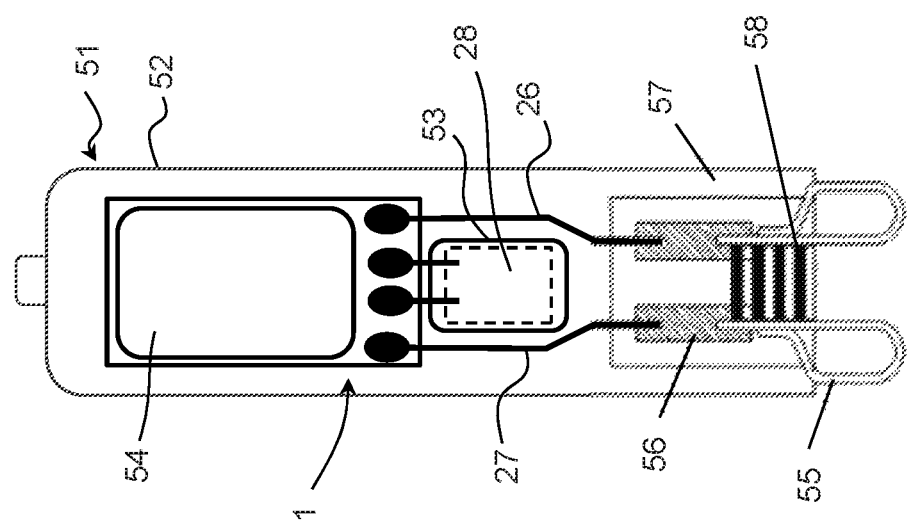
FIG. 10 shows a schematic view from above of an LED light fixture according to another exemplary embodiment.

FIG. 10 shows a schematic view from above of an LED light fixture according to another exemplary embodiment. The LED light fixture 50 of FIG. 10 largely corresponds to the LED light fixture of FIG. 9 and likewise comprises an LED module 1 which is located inside a glass body 51. The LED module 1 of FIG. 10 is constructed according to the embodiment of FIG. 7, so that all contact points of the LED module 1 are located on one long end of the support. The LED module 1 comprises a smoothing capacitor 28 which is likewise provided with a cover 53. In contrast to the LED light fixture of FIG. 9, the smoothing capacitor 28 is accommodated in a compact manner in the light fixture on the base side between the two contact pins 26 and 27.

In the exemplary embodiments illustrated in FIGS. 9 and 10 the LED light fixture 50 of a halogen lamp is simulated. In particular the LED light fixture 50 according to FIGS. 9 and 10 is substantially constructed as a conventional halogen lamp with a G9 plug-in base.

The LED light fixture can be produced in a simple manner, in that an LED module already fitted with contact pins and with the smoothing capacitor is used in a glass body used, for example, in conventional light fixtures.

In some embodiments of the LED light fixture 50, the glass body or glass bulb is vacuum sealed, wherein the interior space of the glass bulb is filled with a gas filling which has a gas or gas mixture with high thermal conduction, for example at least 0.05 W/mK, at least 0.10 W/mK, or at least 0.13 W/mK. In particular, the gas filling can have helium gas and/or hydrogen gas. The gas filling of the glass bulb can also have a mixture of helium with oxygen.

The absolute pressure of the heat-conducting gas in the interior space 25 can be up to 10 bars, or up to 5 bars. The absolute pressure is preferably at least 1 bar, or at least 2 bars. The details of the absolute pressure should be understood to relate to room temperature. The use of a high pressure of the heat-conducting gas enables an improved heat removal inside the LED light fixture 20.

During operation, the LED light fixture 20 is connected to an electrical current source, so that the electronic components 23 or LED driver are supplied with current by the contact pins 24, the contact wires 25 and by the electrical leads (not shown). The LEDs which are electrically connected to the LED driver are likewise supplied with the electrical current and illuminated by the LED driver. The dispersion of the light emitted from the LEDs 6 in the light-scattering encapsulation 9 lets the light-scattering encapsulation 9 appear as a light source, for example, with a diffuse scattering effect. Due to the positioning of the smoothing capacitor along the longitudinal support of the LED module the LED module can be accommodated in a glass body, the dimensions of which do not or not significantly exceed the dimensions of the standard G9 halogen lamp. Thus, an LED replacement light fixture with reduced flickering can be implemented in a simple manner without, in this case, exceeding the standard dimensions of the light fixture to be replaced (i.e., the halogen lamp).

Although at least one exemplary embodiment has been set out in the preceding description, various amendments and modifications can be carried out. The aforementioned embodiments are merely examples and not provided in order to limit the validity range, the applicability or the configuration of the present disclosure in any way. In fact the preceding description provides the person skilled in the art with a plan for implementation of at least one exemplary embodiment, wherein numerous changes in the function and the arrangement of elements described in an exemplary embodiment can be made without departing from the scope of protection of the attached claims and their legal equivalents.

LIST OF REFERENCE NUMERALS

1 LED module
2 support
3 first long end
4 second long end
5 first lateral end
6 second lateral end
7 first main surface
8 second main surface
9 side surface
10 LED
11 transistor
12 diode
13, 14, 15, 16 metal plated structure
17, 18, 19, 20 contact point
21 bonding wire 22, 23, 24, 25 contacts
26, 27 contact pins
28 smoothing capacitor
29 metal plated structure
30 gap
50 LED light fixture
51 glass body
52 wall
53 cover
54 encapsulation
55 contact pin
56 contact plate
57 flattened area
58 reinforcement

The invention claimed is:

1. A light emitting diode (LED) module comprising:
an elongated flat support with a first long end, with a second long end opposite the first long end and with electrically conductive regions;
at least one LED mounted on the flat support; and
an electronic driver with at least one electronic driver component mounted on the flat support for driving the at least one LED,
wherein the electrically conductive regions comprise a first pair of contact points on one of the two long ends for connection of the LED module to a current source and a second pair of contact points on one of the two long ends for connection of a smoothing capacitor to the LED module.

2. The LED module of claim 1, wherein the at least one LED is constructed as a bare LED chip.

3. The LED module of claim 1, wherein the at least one LED is provided with an encapsulation.

4. The LED module of claim 3, wherein the encapsulation has at least one fluorescent substance for conversion of the LED light with an LED light wavelength into a light with a wavelength different from the LED light wavelength.

5. The LED module of claim 1, wherein the flat support is at least somewhat light-permeable.

6. The LED module of claim 1, wherein the electronic driver comprises diodes interconnected to provide a bridge rectifier and a current regulator series-connected to the at least one LED.

7. The LED module of claim 6, wherein the bridge rectifier is electrically connected on an input side to the first pair of contact points and on an output side to the second pair of contact points.

8. The LED module of claim 1, wherein the first pair of contact points and the second pair of contact points are formed on opposing long ends of the flat support.

9. A light emitting diode (LED) light fixture having the LED module recited in claim 1.

10. The LED light fixture of claim 9, wherein the LED light fixture is designed as an LED replacement light fixture.

11. The LED module of claim 1, wherein the at least one electronic driver component mounted on the flat support comprises:
a bridge rectifier; and
a current regulator.

12. The LED module of claim 1, wherein the at least one electronic driver component mounted on the flat support comprises:
at least one transistor; and
at least one diode.

13. The LED module of claim 1, wherein the electronic driver is at least partially constructed as a bare chip.

14. The LED module of claim 1, wherein the at least one electronic driver component is mounted on the flat support in a chip-on-board (COB) configuration.

15. The LED module of claim 1, wherein:
the flat support comprises at least one circuit board; and
the at least one electronic driver component is populated on the at least one circuit board.

16. A method for producing a light emitting diode (LED) module, the method comprising:
providing an elongate flat support with a first long end, with a second long end opposite the first long end and with electrically conductive regions, wherein the electrically conductive regions comprise a first pair of contact points on one of the two long ends for connection of the LED module to a current source and a second pair of contact points on one of the two long ends for connection of a smoothing capacitor to the LED module;
mounting at least one LED on the flat support; and
mounting on the flat support at least one electronic driver component for driving the at least one LED.

17. The method of claim 16, wherein the mounting of the at least one LED and the mounting of the at least one electronic driver component take place substantially simultaneously.

18. The method of claim 16, further comprising:
wire bonding at least one of the at least one LED and the at least one electronic driver component; and
potting of the at least one LED with an encapsulation.

19. The method of claim 18, wherein the method further comprises:
providing solder contacts for connection of the first pair of contact points with contact pins for connection to a current source; and
providing solder contacts for connection of a smoothing capacitor to the second pair of contact points.

20. The method of claim 19, wherein the providing of the solder contacts takes place after the potting of the at least one LED.

* * * * *